United States Patent
Sabisch et al.

(10) Patent No.: US 7,022,209 B2
(45) Date of Patent: Apr. 4, 2006

(54) PVD METHOD AND PVD APPARATUS

(75) Inventors: Winfried Sabisch, München (DE); Alfred Kersch, Putzbrunn (DE); Georg Schulze-Icking, Ottobrunn (DE); Thomas Witke, Dresden (DE); Ralf Zedlitz, Dresden (DE)

(73) Assignee: Infineon Technologies AG, Munich (DE)

( * ) Notice: Subject to any disclaimer, the term of this patent is extended or adjusted under 35 U.S.C. 154(b) by 184 days.

(21) Appl. No.: 10/620,570

(22) Filed: Jul. 16, 2003

(65) Prior Publication Data

US 2004/0011640 A1 Jan. 22, 2004

(30) Foreign Application Priority Data

Jul. 16, 2002 (DE) ................... 102 32 179

(51) Int. Cl.
*C23C 14/35* (2006.01)
(52) U.S. Cl. .............. 204/192.12; 204/298.2; 204/298.22
(58) Field of Classification Search ........... 204/192.12, 204/298.2, 298.22
See application file for complete search history.

(56) References Cited

U.S. PATENT DOCUMENTS

| 5,512,156 A | 4/1996 | Yamanishi et al. .... 204/298.16 |
| 5,770,025 A * | 6/1998 | Kiyota .................. 204/298.2 |
| 6,193,854 B1 | 2/2001 | Lai et al. ............... 204/192.12 |
| 6,500,321 B1 * | 12/2002 | Ashtiani et al. ....... 204/298.12 |
| 2002/0175074 A1 * | 11/2002 | Gung .................... 204/298.19 |

FOREIGN PATENT DOCUMENTS

| DE | 198 27 587 A1 | 12/1999 |
| DE | 199 47 935 A1 | 3/2001 |
| JP | 05148640 A | 6/1993 |
| WO | 90/13137 | 11/1990 |

* cited by examiner

*Primary Examiner*—Steven Versteeg
(74) *Attorney, Agent, or Firm*—Laurence A. Greenberg; Werner H. Stemer; Ralph E. Locher

(57) ABSTRACT

A PVD method and a PVD apparatus use a rotating magnetic field in order to increase the yield. The magnetic field is provided such that it essentially vanishes, at least in a time average, outside a rotation axis of the magnetic field in sectors of the target region of the PVD apparatus. In this manner the PVD method and the PVD apparatus achieve a uniform coating.

30 Claims, 6 Drawing Sheets

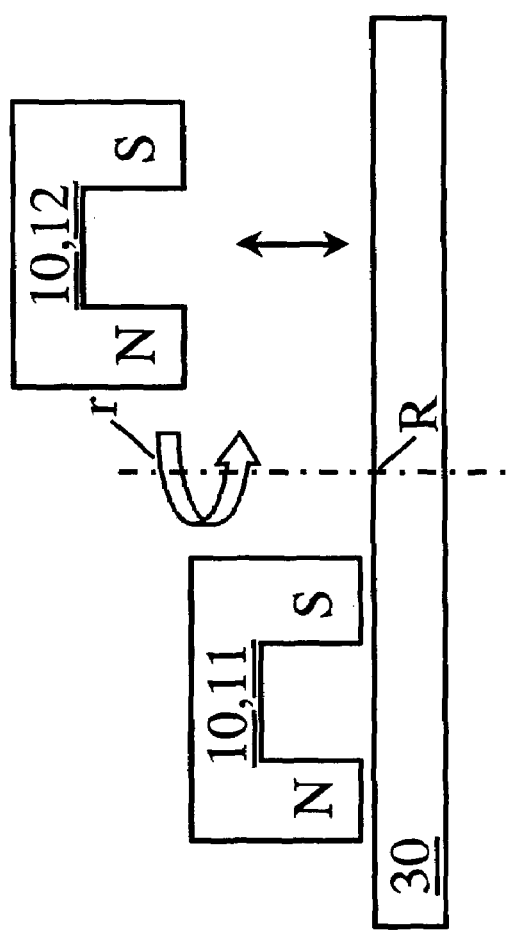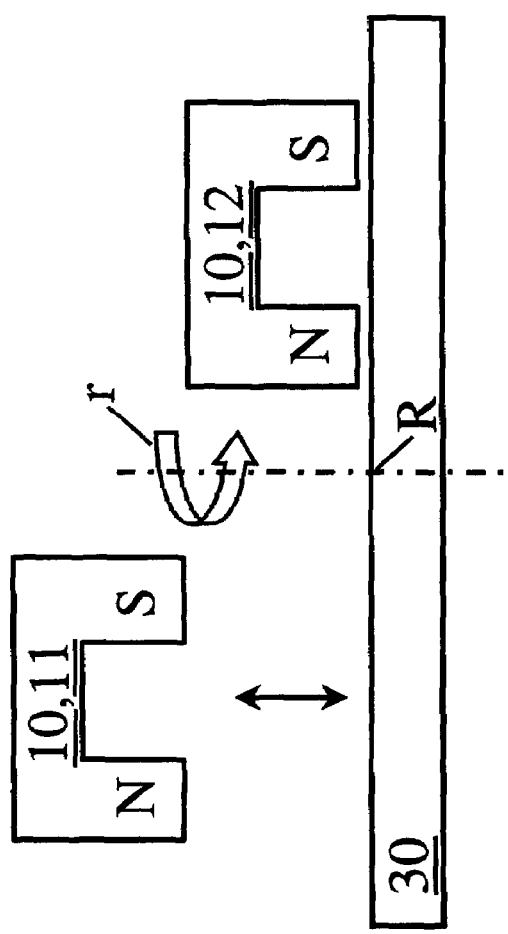

PVD METHOD AND PVD APPARATUS

BACKGROUND OF THE INVENTION

Field of the Invention

The invention relates to a PVD method and a PVD apparatus, in particular for carrying out the PVD method.

Various methods for removing or building up material layers are known. Thus, so-called PVD methods (PVD: physical vapor deposition) are often used e.g. in the semiconductor industry. In principle, this is a plasma discharge method in which process gas ions are generated in a process gas between two electrodes through the use of an applied electric field and are then accelerated further through the use of the electric field to a target of a material that is to be deposited on a substrate. On account of the kinetic energy of the accelerated process gas ions, the latter, upon impinging on the target, eject target constituents from the latter which, for their part, pass to the substrate opposite the target and are deposited there.

In order to improve the deposition rates and yields, the plasma density above the target is increased by building up a magnetic field in addition to the electric field in the region of the target. This magnetic field—a term that is then also used is magnetron sputtering—also reduces the loss of charge carriers, in particular the loss of electrons. In order to improve the uniformity of the removal of target material at the target, the magnetic field is caused to rotate with regard to the target such that a uniform removal of target material is produced.

What is problematic in the context of magnetron sputtering with magnetic fields is that the relative movement of the process gas ions with respect to the magnetic field and the resulting velocity-dependent Lorentz force give rise to an asymmetry of the movement of the process gas ions—accelerated toward the target—with respect to the direction of the normal or perpendicular to the target surface.

This means that the angular distribution of the process gas ions impinging on the target surface is no longer symmetrical with regard to the normal to the target surface. Rather, a preferred direction is established in the direction of the path movement of the Lorentz deflection. This means that the process gas ions impinge on the target surface preferably in the direction of the path velocity or of the Lorentz deflection. Accordingly, the removal of target constituents is also no longer symmetrical with respect to the normal to the target surface. The target constituents likewise rush away from the target surface preferably in the direction to the path velocity or Lorentz deflection.

This leads to asymmetries during the application of material on the substrate surface as well, and thus to systematic faults when constructing micron scale structures.

SUMMARY OF THE INVENTION

It is accordingly an object of the invention to provide a PVD method and a PVD apparatus which overcome the above-mentioned disadvantages of the heretofore-known methods and devices of this general type and which achieve, in a particularly simple manner, the highest possible and most symmetrical possible removal of material at the target and the highest possible and most symmetrical possible application of material at the substrate.

With the foregoing and other objects in view there is provided, in accordance with the invention, a method for physical vapor deposition, the method includes the steps of:

providing a target region and a substrate region disposed in a process region;

providing an electric field between the target region and the substrate region and using the electric field for partially ionizing process gas constituents in the process region, accelerating ionized process gas constituents toward the target region, ejecting target constituents by using process gas constituents and partially depositing ejected target constituents on the substrate region; and generating a magnetic field substantially vanishing in given regions and/or given sectors of the target region and/or the substrate region at least when averaged over time and rotating the magnetic field about a rotation axis.

In other words, the PVD method according to the invention firstly has a step of providing a target region and a substrate region in a process region. Furthermore, an electric field is formed between the target region and the substrate region. Ionized process gas constituents are accelerated toward the target region. Upon impinging thereon, target constituents are ejected by the ionized and accelerated process gas constituents and in part deposited on the substrate region. During these operations, according to the invention, a magnetic field is generated at least in the region of the target region and/or of the substrate region and is rotated in particular about an axis or symmetry axis as rotation axis which spans the target region and the substrate region in linking fashion. In this case, nonvanishing magnetic fields are used whose vectorial sum essentially vanishes on average with respect to time. This results in a symmetrical angular distribution of process gas ions impinging on the target.

This can be realized in various ways, e.g. through internal movement of the field itself, e.g. through rotation outside the actual rotation axis, through polarity reversal or modification of the configuration of the fields or the like.

It is therefore provided that, in accordance with a preferred embodiment of the PVD method, a combination of at least one first magnetic field component and at least one second magnetic field component is used as the magnetic field, and that the first and second magnetic field components have been or are formed such that they are directly oppositely polarized or oriented with respect to one another but otherwise are essentially identical. The actual magnetic field to be applied is then generated overall through the combination of the first and second magnetic field components.

In accordance with a particularly preferred embodiment, the individual magnetic field components for the combination of the total external magnetic field are used and/or generated simultaneously.

For example, it may preferably be provided that the magnetic field components have been or are generated and/or arranged diametrically oppositely with regard to the rotation axis of the total magnetic field and asymmetrically with respect to one another. For example, a combination of north pole and south pole may be formed on one side of the rotation axis of the magnetic field at a first position, while a corresponding combination of south pole and north pole is formed diametrically oppositely, so that north pole and south pole of the magnetic field components are directly opposite one another with regard to the rotation axis.

In another embodiment of the PVD method according to the invention, it is provided that the magnetic field components have been or are generated, arranged and/or caused to take effect temporally separately from one another rather than simultaneously. This may mean e.g. that firstly one component is used for a specific time period and then the other component, which is formed such that it is polarized oppositely to the first component, is subsequently used for another time period.

In this case, it is advantageous that first and second time periods of the separate use and/or generation of the first and second magnetic field components are respectively chosen to be approximately identical to one another individually and/or in their respective sum. It is precisely the approximately temporally identical generation and/or application of oppositely polarized magnetic field components that realizes the temporal averaging for generating a magnetic field that vanishes in its vectorial sum.

In a further embodiment of the PVD method according to the invention, it is provided that the second or first magnetic field component are in each case generated from the first or second magnetic field component, respectively, by polarity reversal, rotation and/or configuration of a magnetic field device respectively used.

With the objects of the invention in view there is also provided, a PVD apparatus, including:

a target region and a substrate region disposed spatially separated from one another in a process region containing a process gas and with an electric field to be generated between the target region and the substrate region; and a magnetic field device configured to generate a magnetic field at least at one of the target region and the substrate region such that the magnetic field substantially vanishes in one of given regions and given sectors of at least one of the target region and the substrate region at least when averaged over time and such that the magnetic field rotates about a rotation axis.

In other words, the object of the invention is achieved by a PVD apparatus, in particular for carrying out the PVD method according to the invention, wherein a target region and a substrate region are provided, which are disposed such that they are spatially separated from one another in a process region with a process gas and between which an electric field can be generated. Furthermore, a magnetic field device is provided, through the use of which a magnetic field can be generated at least in the region of the target region and/or of the substrate region and can be rotated in particular about an axis or symmetry axis as rotation axis which spans the target region and the substrate region in linking fashion, the magnetic field device being able to form the magnetic field essentially in vanishing fashion at least on average with respect to time outside the rotation axis of the magnetic field in sectors or regions of the target region and/or of the substrate region.

Consequently, a central idea of the PVD apparatus according to the invention is to configure the magnetic field device in such a way that it can generate the magnetic field outside the rotation axis in regions or sectors of the target region and/or of the substrate region, which magnetic field can be formed essentially in vanishing fashion, once again averaged with respect to time.

To that end, it is provided that the magnetic field device is configured for generating at least one first magnetic field component and at least one second magnetic field component in such a way that the magnetic field components can be formed such that they are directly oppositely polarized with respect to one another, but otherwise are essentially identical.

In accordance with a further preferred embodiment of the PVD apparatus according to the invention, it is provided that the magnetic field device has at least one first and at least one second magnetic device. The latter generate, in particular, the first magnetic field component and the second magnetic field component, respectively.

In another preferred embodiment, it is provided that the first and second magnetic field devices are formed and arranged or can be arranged such that they are oppositely polarized or polarizable with respect to one another. In other words, the opposite polarization of the magnetic field components can be effected through positioning or changing of the positioning of the magnetic device or through polarity reversal of the magnetic devices as such, or through corresponding circuitry connection with a distribution of field-generating electric currents.

In accordance with a further preferred embodiment of the PVD apparatus according to the invention, it is provided that the first and second magnetic devices are arranged diametrically oppositely with regard to the rotation axis.

Furthermore, it may be provided that the magnetic field device is formed such that it can be rotated about the rotation axis, in particular above the target region outside the process region. As an alternative to this, the magnetic field device may also be arranged in stationary fashion and the magnetic field rotation may result from corresponding driving or circuitry connection of the magnetic field device.

In a further embodiment, it is provided that a single magnetic device is formed, that the magnetic device is formed such that it can be moved or rotated about a body axis of the magnetic device at least between a first position and a second position, and that a first magnetic field component can be generated in the first position and essentially a second magnetic field component can be generated in the second position, the magnetic field components being directly oppositely polarized with respect to one another.

In this case, it is provided, in particular, that the body axis with respect to the magnetic field device is made parallel or perpendicular to the rotation axis. This results, then, in a displacement in the direction of the rotation axis or perpendicular thereto.

In a further embodiment of the PVD apparatus according to the invention, it is provided that the magnetic device and in particular the magnetic devices in each case have an individual magnetic field shielding device, which can shield the respective magnetic field or the respective magnetic field component, in particular from the target region.

Furthermore, it is provided that the magnetic field shielding device has a material of high magnetic permeability, in order that the shielding effect is configured in a particularly favorable manner.

In a further embodiment, it is provided that the magnetic field device and in particular the magnetic devices are formed such that they can be displaced in the direction of the rotation axis of the magnetic field, in particular between a first position, brought closer to the target region, and a second position, remote from the target region.

The magnetic devices may be configured in various ways. On the one hand, the magnetic devices may be permanent magnets. In this case, the corresponding field geometries of the total magnetic field and in particular of the respective magnetic field components can then be formed through the use of the choice of the configuration or positioning of individual magnets or through the use of the movement of individual magnets with regard to one another and with regard to the target region.

On the other hand, the magnetic field device and in particular the individual magnetic devices may also be formed as configurations of conductors through which current flows, e.g. coils. The respective geometry of the magnetic field and its change with respect to time can then be realized either once again by the movement, configuration or positioning of the coils or conductors through which current flows with respect to one another or in addition or as an alternative by the way in which electric currents are applied to the conductors through which current flows. Through corresponding circuitry connection and control of the configuration of conductors through which current flows, a rotating magnetic field can then be generated, e.g. without the conductors through which current flows changing their position with respect to one another or with respect to the target region.

Further aspects of the invention emerge from the remarks below:

A PVD process (physical vapor deposition) is often used for the deposition of a wide variety of layers in the semiconductor industry. This involves e.g. a DC plasma discharge. By way of example, ions are accelerated toward a metallic target and, on account of their kinetic energy, eject or sputter constituents from the target. These constituents are deposited on a substrate after as far as possible collision-free transport through a chamber.

Modification of the pure PVD method has given rise to developed methods in which some of the metal atoms, for example, are postionized, so that, in addition to the metallic neutral particle stream, ionized metal also reaches the substrate. In order to achieve a higher plasma density (higher sputtering rate), a magnet (magnetron magnet) is fitted above the target and, inter alia, reduces the loss of electrons and an increased plasma density is thus generated below the magnet. In present-day commercially available installations, the magnetron magnet rotates above the target, thereby effecting a uniform removal at the target.

The gas ions are accelerated in the electric field in the direction of the target. The magnetic field additionally acts on the gas ions and causes a deflection thereof in the direction of rotation. Consequently, the gas ions do not impinge on the target in the direction of the normal. This brings about a distribution of the sputtered metal atoms which is likewise asymmetrical in the rotation direction. For the layer deposited on the substrate, this means an asymmetry with respect to the rotation direction.

To date, no action has been taken to avoid the problem discussed above since, as first-order effect, firstly there has been a reduction of the radial asymmetry with regard to the rotation axis on the substrate. However, the problem of asymmetry in the rotation direction occurs in many applications and structures and must be solved in this context.

This invention proposes new structures and a new process for avoiding asymmetry in the rotation direction of the magnetron magnet.

The gas ions accelerated toward the target are deflected by the Lorentz force $\vec{F}_L = q(\vec{v} \times \vec{B} + \vec{E})$ wherein q is a charge, $\vec{v}$ is a velocity, $\vec{B}$ is the magnetic field and $\vec{E}$ is the electric field.

Estimates for typical process conditions during magnetron sputtering produce a deflection of the gas ions of approximately 5°. The result of a simulation of the angular distribution in various processes is represented at the bottom of FIG. 2. The profile of the dashed curve, which was calculated on the basis of magnetron process conditions, confirms the theoretical estimates.

The gas ions which thus impinge obliquely on the target sputter metal atoms. FIG. 3 shows the preferred direction of the angular distribution of the sputtered metal atoms. Oblique incidence on the target results in an asymmetry with regard to the rotation direction. In order to avoid this asymmetry, the invention proposes various structures and processes which in each case include modification of the magnetron magnet.

The introduction of new magnetron magnets or the introduction of new processes reduces the asymmetry in the rotation direction of the magnetron magnet with regard to the layer deposition on a substrate.

FIGS. 4, 5 and 6 below show exemplary embodiments of the invention. FIG. 4 shows a magnetron magnet including two parts of different polarity. In this case, a plasma burns under both magnets, the sputtering rate thereby being increased.

FIG. 5 shows a similar structure to FIG. 4, likewise including two magnetron magnets. In this case, however, the magnets are mounted such that they are movable. The first half of the process is carried out with the right-hand magnet lowered, and the second half with the left-hand magnet lowered. On account of the spatial drop of the magnetic field, the latter does not act on the chamber and the plasma in the elevated position. Optionally, shielding of the magnetic field may be provided as an alternative or in addition to the lowering, in which case a shielding device would then be inserted between magnet and target.

In FIG. 6, only one magnetron magnet is proposed but it is configured symmetrically. A flip-over operation in the second half of the process results in the desired polarity reversal of the magnetic field.

What is proposed as a new process is, inter alia, to carry out the PVD layer deposition in two chambers using magnetron magnets of different polarity.

Other features which are considered as characteristic for the invention are set forth in the appended claims.

Although the invention is illustrated and described herein as embodied in a PVD method and a PVD apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 5A are 5B are diagrammatic side views of a further embodiment of a PVD apparatus according to the invention for illustrating two states of the PVD apparatus.

DESCRIPTION OF THE PREFERRED EMBODIMENTS

Figure 1:
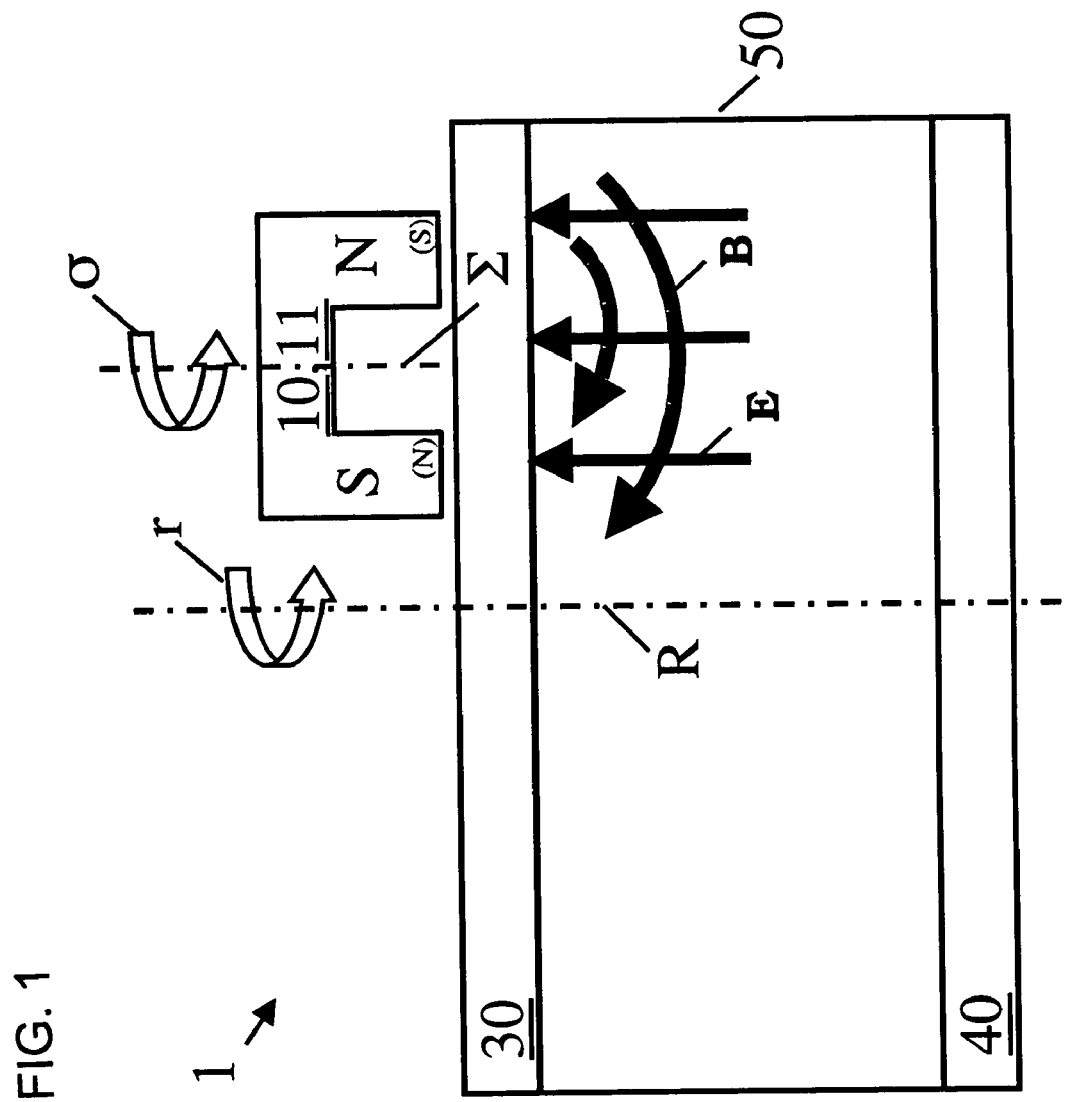
FIG. 1 is a diagrammatic and partly sectional side view of a first embodiment of the PVD apparatus according to the invention.

Referring now to the figures of the drawings in detail and first, particularly, to FIG. 1 thereof, there is shown a first embodiment of the PVD apparatus 1 according to the invention.

In the case of this PVD apparatus 1, in a process region 50, e.g. in a recipient, a target 30 of a material to be deposited is provided on one side. Opposite the target 30, a substrate 40 to be coated is introduced in the process region 50. Above and below, target 30 and substrate 40 are also designated as target region 30 and substrate region 40, respectively, both designations being used synonymously. The configuration including process region 50, target region 30 and substrate region 40 is constructed cylindrically symmetrically with regard to a symmetry axis R. A magnetic field device 10 with an individual magnetic device 11 is provided on that side of the target region 30 which is remote from the process region 50. In the embodiment of FIG. 1, the magnetic device 11 is a magnet with a south pole on the left-hand and a north pole on the right-hand side. The magnetic device 11 is constructed mirror-symmetrically with regard to a body axis Σ. The magnetic device 11 itself can be made to effect a rotational movement r about the rotation axis R. Given the orientation indicated in FIG. 1, during the rotation of the magnetic device 11 about the axis R, the south pole S of the magnetic device 11 always moves on the inner side, while the north pole N of the magnetic device 11 always runs on the outer side. Through rotation or through swinging about the body axis Σ of the magnetic device 11 in accordance with the swinging direction (flop over direction) or rotation direction σ, the magnetic device 11 can be oriented oppositely to the polarization state shown in FIG. 1, thus producing the orientation indicated in round brackets, in which case the north pole N of the magnetic device 11 is then arranged at the rotation axis R and the south pole S of the magnetic device 11 is arranged remote from the rotation axis R.

An electric field E is formed between the target region 30 and the substrate region 40 when the PVD method according to the invention is carried out through the use of the PVD apparatus 1 according to the invention. At the same time, the magnetic field device 10 with its individual magnetic device 11 generates a magnetic field B. The latter is rotated by rotation about the axis R in the direction r above the target region 30. By changing the orientations in accordance with the swinging or rotation about the body axis Σ, it is then possible to generate, according to the invention, a symmetrization with regard to the respective sectors or regions of the target region 30 and/or of the substrate region 40.

Figure 2:
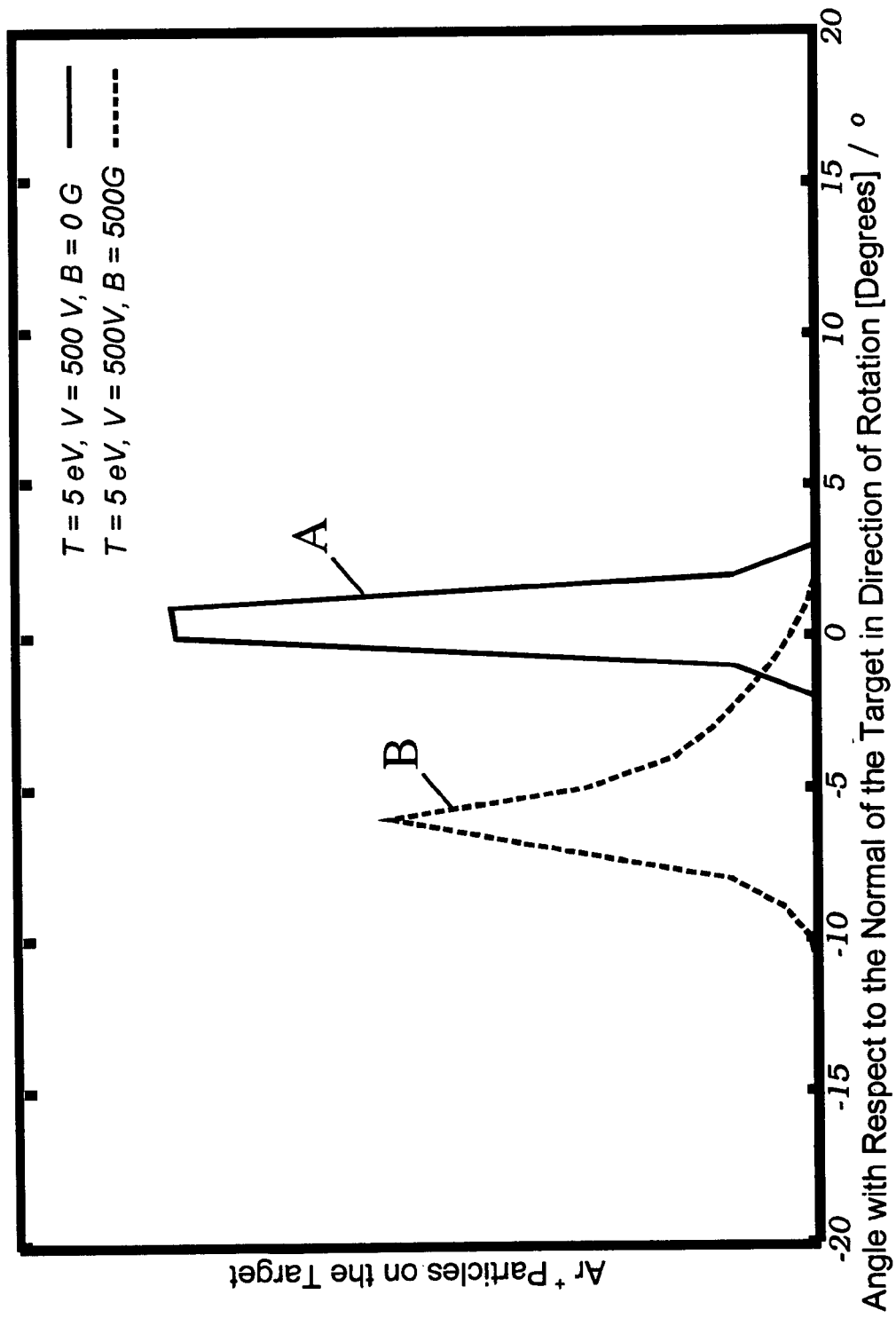
FIG. 2 is a graph illustrating the relationship between flight direction of ionized process gas constituents and the presence of a magnetic field.

FIG. 2 shows, in the form of a graph, a frequency distribution of the process gas particles in the recipient or in the process region 50 which impinge on the target 30, for the case where argon is used as process gas. In this case, curve A of FIG. 2 shows the distribution of argon ions for the case of a vanishing magnetic field. It is evident that the frequency is concentrated around the origin, i.e. around an angle of 0°, which corresponds to the normal to the target region 30, to be precise in an essentially symmetrical form. By contrast, the dashed curve B shows the distribution of argon ions as a function of the angle with respect to the normal to the target surface upon application of a magnetic flux density B=500 G. It is clearly evident that the frequency is concentrated about an angle of approximately −5° with regard to the normal to the target, that is to say runs asymmetrically with regard to the normal at 0°.

The present invention endeavors to avoid this asymmetrical distribution when using a rotating magnetic field in the context of a PVD method.

FIG. 3 illustrates that the direction distribution in accordance with FIG. 2 also has the consequence of a direction distribution with regard to the material removal at the target 30.

Figure 3B:
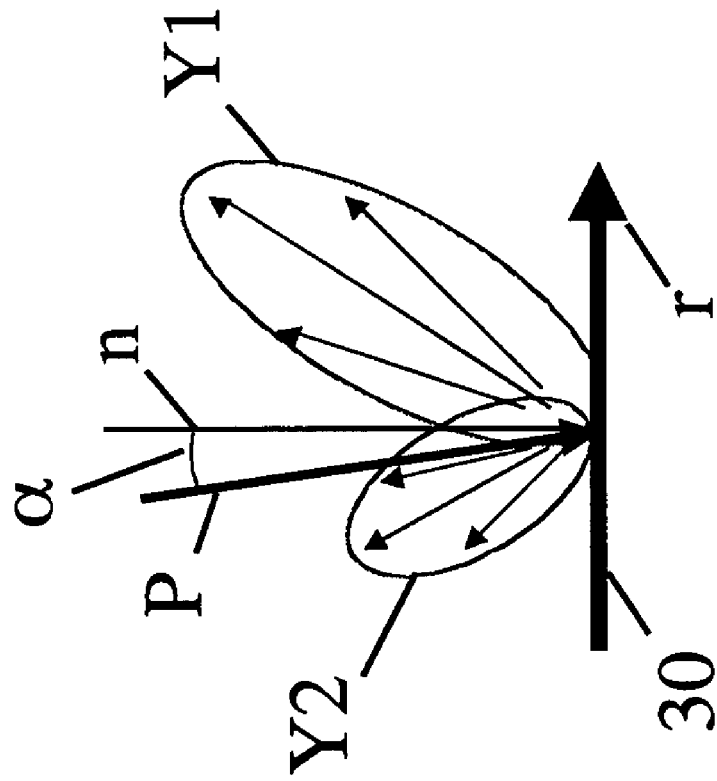
FIGS. 3A and 3B are graphs illustrating the conditions of the material removal at the target depending on the presence of a rotating magnetic field.
Figure 3A:
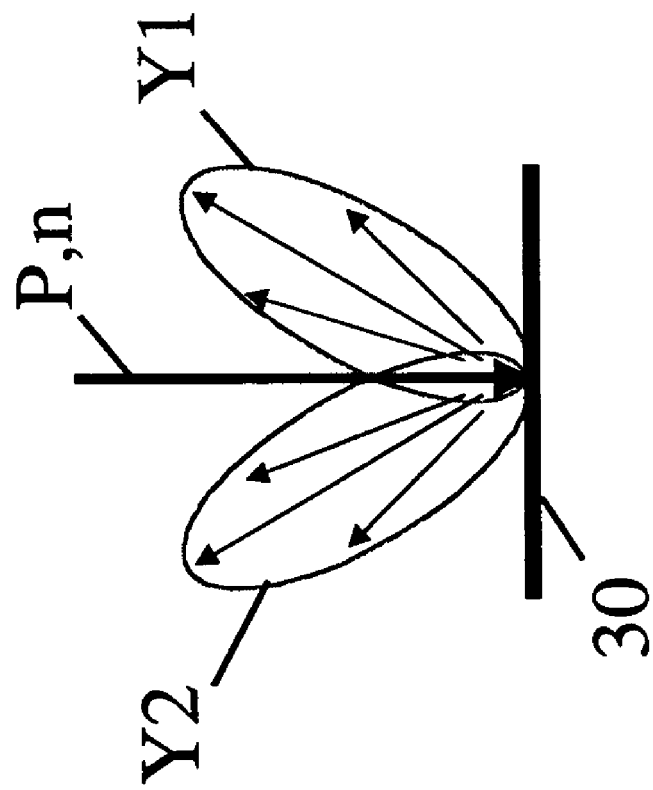

In this case, FIG. 3A corresponds to the yield or material removal Y1, Y2 for the case of a vanishing rotating magnetic field. This therefore corresponds to the situation of curve A from FIG. 2. In this case, the particle stream P of process gas ions impinges on the target 30 parallel to the normal n to the target 30. On account of the kinetic energy of the process gas ions P, constituents of the substrate region 30 are ejected from the surface and leave the target region 30 symmetrically with regard to the normal n, which is illustrated by the symmetrical yield cloud Y2.

In the case of FIG. 3B, the ion stream P of process gas ions is inclined by an angle a with respect to the normal n to the target region 30. The yield clouds Y1 and Y2 produced upon ejection are correspondingly formed asymmetrically, to be precise in such a way that the yield cloud Y1 is manifested in intensified fashion in the direction r of rotation compared with the situation of FIG. 3A, while the rear yield cloud Y2 is manifested in diminished fashion compared with the situation from FIG. 3A without a magnetic field. This problem is avoided through the use of the present invention.

Figure 4:
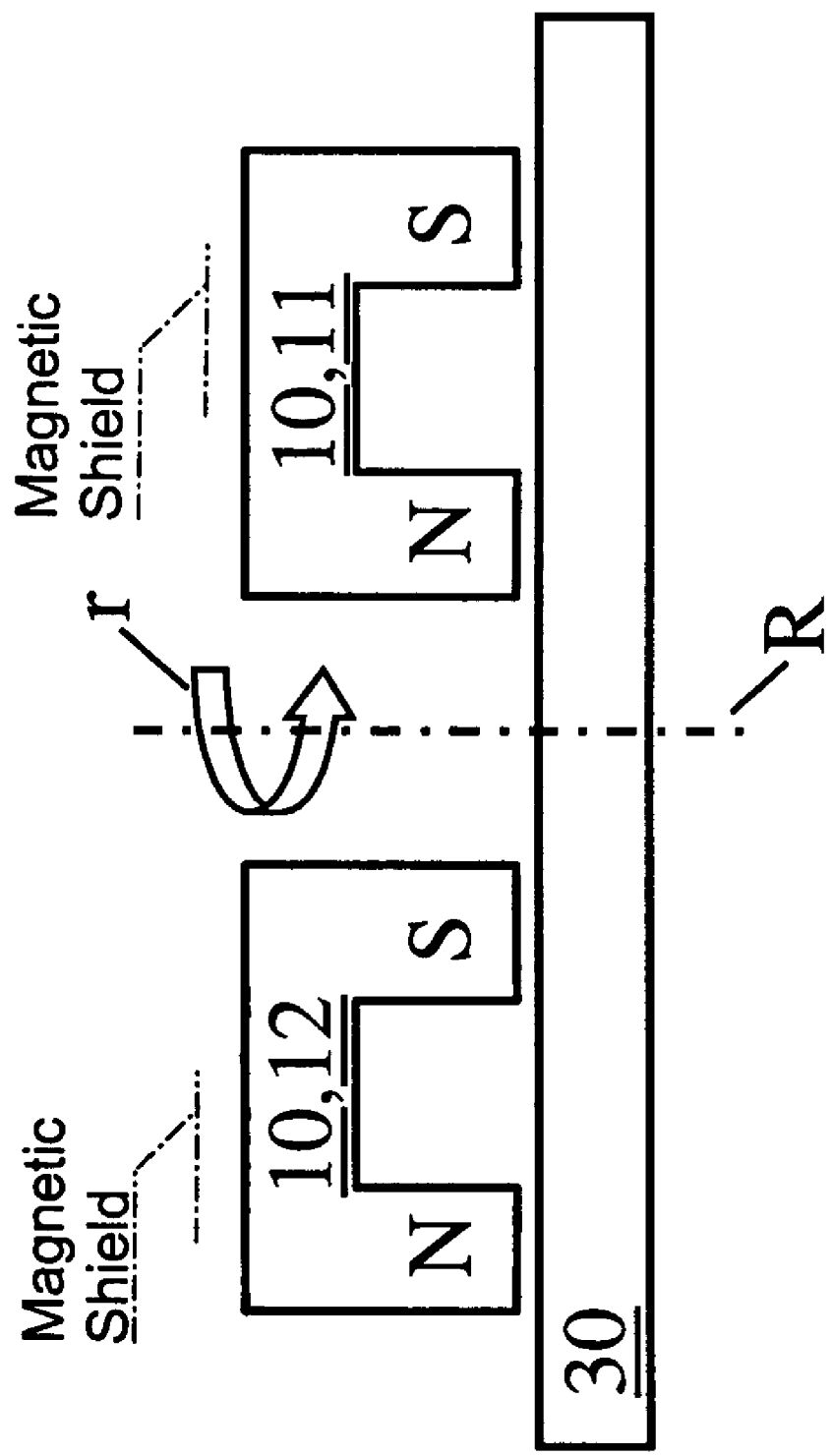
FIG. 4 is a diagrammatic side view of a further embodiment of a PVD apparatus according to the invention.

FIG. 4 shows a further embodiment of the PVD apparatus according to the invention likewise in a diagrammatic and cross-sectional side view. In this case, the magnetic field device 10 has a first magnetic device 11 and a second magnetic device 12. The first and second magnetic devices 11 and 12 are diametrically opposite one another with regard to the rotation axis R. They are polarized oppositely with respect to one another, but otherwise have identical properties. During operation, the first and second magnetic devices 11 and 12 are rotated jointly and in a manner fixed relative to one another about the rotation axis R on that side of the target 30 which is remote from the process region 50. On account of the oppositely oriented orientation of the two magnetic devices 11 and 12, a symmetrical field distribution results in an averaged manner on average with respect to time in each region or sector of the target region 30 outside the rotation axis R, as a result of which the yield asymmetry or the asymmetry of the material removal at the target 30 is prevented on average.

FIGS. 5A and 5B show two operating states of another embodiment of the PVD apparatus according to the invention.

Here, too, as in the embodiment of FIG. 4, the magnetic field device 10 is provided with two magnetic devices 11 and 12, which are formed identically with regard to one another except for their asymmetrically oppositely oriented orientation. During operation, as in the embodiment of FIG. 4, the two magnetic devices 11 and 12 are rotated jointly and in a manner fixed relative to one another about the common rotation axis R on that side of the target region 30 which is remote from the process region 50. In this case, in a first phase of the process implementation, illustrated by FIG. 5A, only the first magnetic device 11 is brought to bear because the second magnetic device 12 is displaced in the direction of the common rotation axis R and is thus further away from the target region 30 than the first magnetic device 11. The situation is reversed, on the other hand, in the state of FIG. 5B, where, specifically, the second magnetic device 12 has been brought closer to the target, while the first magnetic device has now been displaced in the direction of the common rotation axis R and is thus arranged at a distance from the target region 30, so that its field component B1 is not effective in this process phase.

Figure 6A:
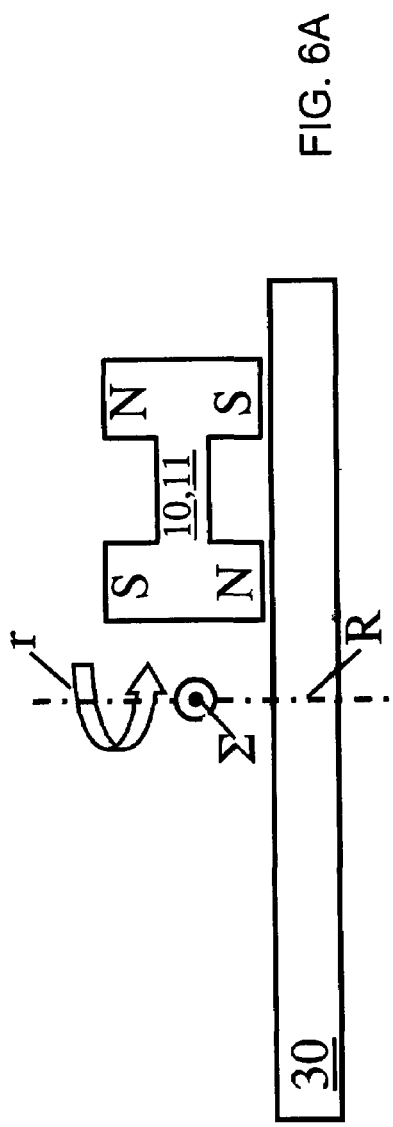
FIGS. 6A and 6B are diagrammatic side views of a further embodiment of a PVD apparatus according to the invention for illustrating two states of the PVD apparatus.
Figure 6B:
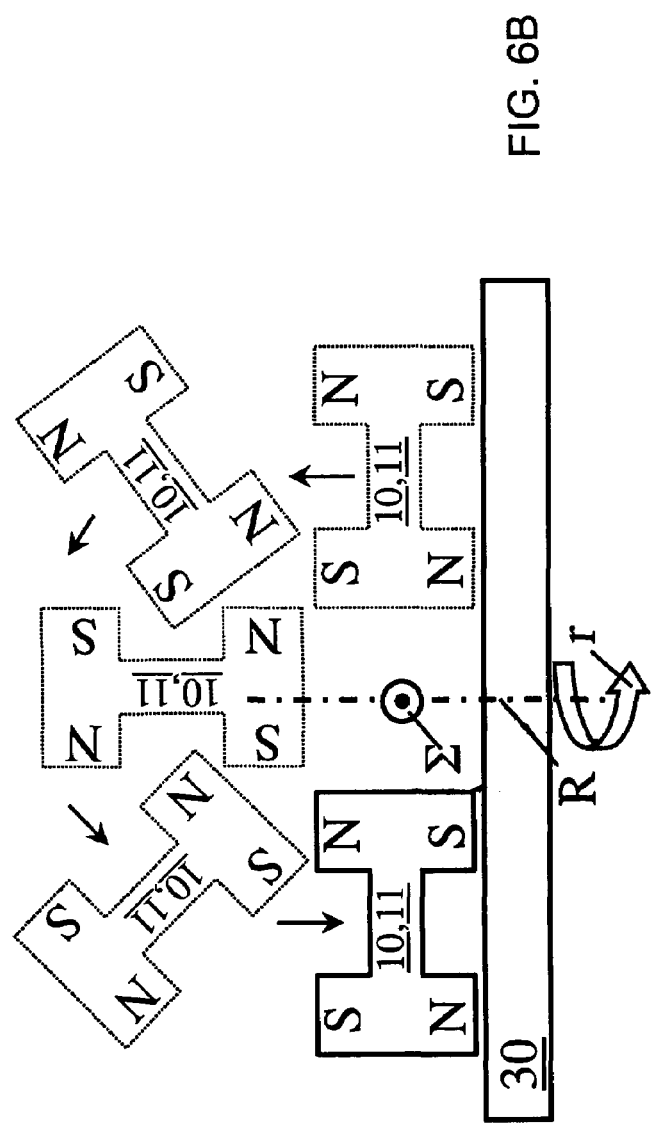

FIGS. 6A and 6B show another embodiment of the PVD apparatus according to the invention. In this embodiment, however, the magnetic field device is once again provided only with a single magnetic device 11. However, in this case the individual magnetic device 11 is formed mirror-symmetrically with respect to a body axis Σ, which in this case points in the plane of the drawing and thus runs perpendicularly with respect to the direction of the rotation axis R. The magnetic device 11 of the embodiment of FIGS. 6A and 6B thus combines in itself two magnets of oppositely oriented orientation. In the process state of FIG. 6A, the first side is brought close to the target region 30, in the case of which a south pole S lies in the vicinity of the rotation axis R and a north pole N is arranged remote from the latter. In this state, the magnet is rotated about the axis R for a first time period T1. For a second time period T2, which, for reasons of symmetry, must not differ significantly from the first time period T1, the configuration of FIG. 6B is then chosen in order then to rotate the magnetic device 11 once again about the axis R above the target region 30. The configuration of FIG. 6B is obtained by swinging over the magnetic device 11 from the state of FIG. 6A into the state of FIG. 6B, as is indicated by broken lines. If the time periods of rotation of the magnetic device 11 are approximately identical in the state of FIG. 6A and in the state of FIG. 6B, then an essentially symmetrical field is produced on average with respect to time outside the rotation axis R in regions or sectors of the target region 30 and/or of the substrate region 40, even if the field distribution in these regions is asymmetrical for each of the individual process sections 6A and 6B.

We claim:

1. A method for physical vapor deposition, the method which comprises:
   providing a target region and a substrate region disposed in a process region;
   providing an electric field between the target region and the substrate region and using the electric field for partially ionizing process gas constituents in the process region, accelerating ionized process gas constituents toward the target region, ejecting target constituents by using process gas constituents and partially depositing ejected target constituents on the substrate region;
   generating a magnetic field substantially vanishing in one of given regions and given sectors of at least one of the target region and the substrate region at least when averaged over time and rotating the magnetic field about a rotation axis;
   generating the magnetic field such that the magnetic field substantially vanishes outside the rotation axis in one of given regions and given sectors of at least one of the target region and the substrate region at least when averaged over time;
   using, as the magnetic field, a combination of at least a first magnetic field component and at least a second magnetic field component such that the first and second magnetic field components are one of directly oppositely polarized or directly oppositely directed with respect to one another but otherwise are substantially identical; and
   one of generating or providing the first and second magnetic field components temporally separately with respect to one another.

2. The method according to claim 1, which comprises using, as the rotation axis, an axis extending through the target region and the substrate region such that the axis connects the target region and the substrate region to one another.

3. The method according to claim 1, which comprises using, as the rotation axis, a symmetry axis extending through the target region and the substrate region such that the symmetry axis connects the target region and the substrate region to one another.

4. The method according to claim 1, which comprises one of generating and using the first and second magnetic field components simultaneously.

5. The method according to claim 1, which comprises one of generating and providing the first and second magnetic field components diametrically oppositely with regard to the rotation axis and antisymmetrically with respect to one another.

6. The method according to claim 1, which comprises choosing first and second time periods for one of a separate use and a separate generation of the first and second magnetic field components such that the first and second time periods are individually substantially identical to one another.

7. The method according to claim 1, which comprises choosing first and second time periods of one of a separate use and a separate generation of the first and second magnetic field components such that respective sums of the first and second time periods are substantially identical to one another.

8. The method according to claim 1, which comprises generating one of the second and first magnetic field component from one of the first and second magnetic field component, respectively, by performing, with a respective magnetic field device, an action selected from the group consisting of a polarity reversal, a rotation and a positioning of the magnetic field device.

9. A PVD apparatus, comprising:
   a target region and a substrate region disposed spatially separated from one another in a process region containing a process gas and with an electric field to be generated between said target region and said substrate region;
   a magnetic field device configured to generate a magnetic field at least at one of said target region and said substrate region such that the magnetic field substantially vanishes in one of given regions and given sectors of at least one of said target region and said substrate region at least when averaged over time and such that the magnetic field rotates about a rotation axis;
   said magnetic field device generating the magnetic field such that the magnetic field substantially vanishes outside the rotation axis in at least one of the given regions and the given sectors of at least one of said target region and said substrate region at least when averaged over time;
   said magnetic field device being a single magnetic device having a body axis; and
   said magnetic device being configured to be one of moved or rotated about the body axis of said magnetic device at least between a first position and a second position and said magnetic device being configured to generate, in the first position, substantially a first magnetic field component and, in the second position, substantially a second magnetic field component such that the first and second magnetic field components are one of directly oppositely oriented with respect to one another or directly oppositely polarized with respect to one another.

10. The PVD apparatus according to claim 9, wherein the rotation axis extends through said target region and said substrate region such that the rotation axis connects said target region and said substrate region to one another.

11. The PVD apparatus according to claim 9, wherein the rotation axis is a symmetry axis extending through said target region and said substrate region such that the symmetry axis connects said target region and said substrate region to one another.

12. The PVD apparatus according to claim 9, wherein said magnetic field device is configured to generate at least a first magnetic field component and at least a second magnetic field component such that the first and second magnetic field components are one of directly oppositely polarized and directly oppositely directed with respect to one another but otherwise are substantially identical.

13. The PVD apparatus according to claim 9, wherein said magnetic field device is rotatable about the rotation axis.

14. The PVD apparatus according to claim 9, wherein said magnetic field device is rotatable about the rotation axis and disposed above said target region outside said process region.

15. The PVD apparatus according to claim 9, wherein the body axis of said magnetic device is one of parallel and perpendicular to the rotation axis.

16. The PVD apparatus according to claim 9, wherein said magnetic field device is configured to be displaceable in a direction of the rotation axis of the magnetic field.

17. The PVD apparatus according to claim 9, wherein said magnetic field device includes at least one permanent magnet.

18. The PVD apparatus according to claim 9, wherein said magnetic field device includes at least one current-carrying conductor.

19. The PVD apparatus according to claim 9, wherein said magnetic field device includes at least one current-carrying coil.

20. The PVD apparatus according to claim 9, wherein said magnetic field device includes at least one of conductors and coils configured to carry electrical currents in a controlled manner and independently of one another.

21. The PVD apparatus according to claim 20, wherein at least one of said conductors and said coils generate a rotating magnetic field having a controllable orientation.

22. A PVD apparatus, comprising:
a target region and a substrate region disposed spatially separated from one another in a process region containing a process gas and with an electric field to be generated between said target region and said substrate region;
a magnetic field device configured to generate a magnetic field at least at one of said target region and said substrate region such that the magnetic field substantially vanishes in one of given regions and given sectors of at least one of said target region and said substrate region at least when averaged over time and such that the magnetic field rotates about a rotation axis;
said magnetic field device generating the magnetic field such that the magnetic field substantially vanishes outside the rotation axis in at least one of the given regions and the given sectors of at least one of said target region and said substrate region at least when averaged over time;

said magnetic field device including at least one first magnetic field device and at least one second magnetic field device; and
said magnetic device being configured to be one of moved or rotated about the body axis of said magnetic device at least between a first position and a second position and said magnetic device being configured to generate, in the first position, substantially a first magnetic field component and, in the second position, substantially a second magnetic field component such that the first and second magnetic field components are one of directly oppositely oriented with respect to one another or directly oppositely polarized with respect to one another.

23. The PVD apparatus according to claim 22, wherein said first and second magnetic field devices are configured such that they are oppositely polarized.

24. The PVD apparatus according to claim 22, wherein said first and second magnetic field devices are positioned such that they are oppositely polarized.

25. The PVD apparatus according to claim 22, wherein said first and second magnetic field devices are disposed diametrically oppositely with regard to the rotation axis.

26. The PVD apparatus according to claim 22, wherein said first and second magnetic field devices are configured to be displaceable in a direction of the rotation axis of the magnetic field.

27. A PVD apparatus, comprising:
a target region and a substrate region disposed spatially separated from one another in a process region containing a process gas and with an electric field to be generated between said target region and said substrate region;
a magnetic field device configured to generate a magnetic field at least at one of said target region or said substrate region such that the magnetic field substantially vanishes in one of given regions or given sectors of at least one of said target region or said substrate region at least when averaged over time and such that the magnetic field rotates about a rotation axis;
said magnetic field device generating the magnetic field such that the magnetic field substantially vanishes outside the rotation axis in at least one of the given regions or the given sectors of at least one of said target region or said substrate region at least when averaged over time; and
said magnetic field device having a magnetic field shielding device for shielding the magnetic field.

28. The PVD apparatus according to claim 27, wherein the magnetic field shielding device includes a material of high magnetic permeability.

29. A PVD apparatus, comprising:
a target region and a substrate region disposed spatially separated from one another in a process region containing a process gas and with an electric field to be generated between said target region and said substrate region;
a magnetic field device configured to generate a magnetic field at least at one of said target region or said substrate region such that the magnetic field substantially vanishes in one of given regions or given sectors of at least one of said target region or said substrate region at least when averaged over time and such that the magnetic field rotates about a rotation axis;
said magnetic field device generating the magnetic field such that the magnetic field substantially vanishes outside the rotation axis in at least one of the given regions or the given sectors of at least one of said target region or said substrate region at least when averaged over time;

said magnetic field device including at least one first magnetic field device and at least one second magnetic field device; and said first and second magnetic field devices having respective magnetic field shielding devices for shielding one of respective magnetic fields or respective magnetic field components from said target region.

30. A PVD apparatus, comprising:

a target region and a substrate region disposed spatially separated from one another in a process region containing a process gas and with an electric field to be generated between said target region and said substrate region;

a magnetic field device configured to generate a magnetic field at least at one of said target region or said substrate region such that the magnetic field substantially vanishes in one of given regions or given sectors of at least one of said target region or said substrate region at least when averaged over time and such that the magnetic field rotates about a rotation axis;

said magnetic field device generating the magnetic field such that the magnetic field substantially vanishes outside the rotation axis in at least one of the given regions or the given sectors of at least one of said target region or said substrate region at least when averaged over time;

said magnetic field device being configured to be displaceable in a direction of the rotation axis of the magnetic field between a first position relatively closer to said target region and a second position relatively more remote from said target region.

* * * * *